(12) United States Patent
Paramio Joves et al.

(10) Patent No.: US 10,096,508 B2
(45) Date of Patent: Oct. 9, 2018

(54) ASSEMBLY FOR HANDLING A SEMICONDUCTOR DIE AND METHOD OF HANDLING A SEMICONDUCTOR DIE

(71) Applicant: INFINEON TECHNOLOGIES AG, Neubiberg (DE)

(72) Inventors: Ronald Paramio Joves, Melaka (MY); Thanabal Ganesh Kunamani, Seremban (MY); Kuang Ming Lee, Melaka (MY); Avelino Oliveros Sumagpoa, Melaka (MY); Kian Heong Tan, Melaka (MY); Nestor Vergara Bicomong, Melaka (MY); Jagen Krishnan, Muar (MY); Soon Hock Tong, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/826,223

(22) Filed: Aug. 14, 2015

(65) Prior Publication Data
US 2016/0049325 A1    Feb. 18, 2016

(30) Foreign Application Priority Data
Aug. 18, 2014    (DE) ................. 10 2014 111 744

(51) Int. Cl.
*B32B 38/10*    (2006.01)
*H01L 21/683*    (2006.01)
(Continued)

(52) U.S. Cl.
CPC ....... *H01L 21/6836* (2013.01); *B25J 11/0095* (2013.01); *B32B 37/0046* (2013.01);
(Continued)

(58) Field of Classification Search
CPC . B32B 38/10; B32B 43/006; Y10T 156/1132; Y10T 156/1158;
(Continued)

(56) References Cited

U.S. PATENT DOCUMENTS 5,238,876 A * 8/1993 Takeuchi ............. B28D 5/0011
156/229
5,622,900 A    4/1997 Smith
(Continued)

FOREIGN PATENT DOCUMENTS

| CN | 1101458 A | 4/1995 |
|---|---|---|
| JP | 2002141392 A | 5/2002 |
| TW | 296459 B | 1/1997 |

*Primary Examiner* — Mark A Osele
*Assistant Examiner* — Nickolas Harm
(74) *Attorney, Agent, or Firm* — Viering, Jentschura & Partner mbb

(57) ABSTRACT

In various embodiments, an assembly for handling a semiconductor die is provided. The assembly may include a carrier with a surface. The assembly may also include an adhesive tape fixed to the surface of the carrier. The adhesive tape may be configured to adhere to the semiconductor die. The adhesive tape may include adhesive, the adhesion of which can be reduced by means of electromagnetic waves. The assembly may further include an electromagnetic source configured to apply electromagnetic waves to the adhesive tape to reduce adhesion of the adhesive tape to the semiconductor die. The assembly may additionally include a die pick-up component configured to pick up the semiconductor die from the adhesive tape.

18 Claims, 20 Drawing Sheets

(51) Int. Cl.
 *B25J 11/00* (2006.01)
 *B32B 37/00* (2006.01)
 *H01L 21/67* (2006.01)
 *B32B 43/00* (2006.01)

(52) U.S. Cl.
 CPC .. *H01L 21/67092* (2013.01); *H01L 21/67115* (2013.01); *H01L 21/67132* (2013.01); *H01L 21/6838* (2013.01); *B32B 38/10* (2013.01); *B32B 43/006* (2013.01); *H01L 2221/68327* (2013.01); *H01L 2221/68381* (2013.01); *Y10T 156/1132* (2015.01); *Y10T 156/1158* (2015.01); *Y10T 156/1179* (2015.01); *Y10T 156/1917* (2015.01); *Y10T 156/1944* (2015.01); *Y10T 156/1983* (2015.01)

(58) Field of Classification Search
 CPC ......... Y10T 156/1179; Y10T 156/1917; Y10T 156/1944; Y10T 156/1983
 USPC ....... 156/707, 712, 716, 753, 758, 765, 932, 156/943
 See application file for complete search history.

(56) References Cited

U.S. PATENT DOCUMENTS

| | | | |
|---|---|---|---|
| 5,827,394 A * | 10/1998 | Lu | B32B 38/10 156/701 |
| 5,981,361 A * | 11/1999 | Yamada | H01L 21/6835 257/E21.599 |
| 6,524,881 B1 * | 2/2003 | Tandy | H01L 21/67282 257/E23.179 |
| 6,561,743 B1 * | 5/2003 | Nakatsu | H01L 21/67132 156/750 |
| 7,122,447 B2 * | 10/2006 | Abe | H01L 21/67092 257/E21.505 |
| 7,759,164 B2 * | 7/2010 | Maki | H01L 21/67132 156/66 |
| 8,021,964 B2 * | 9/2011 | Akiyama | H01L 21/3043 257/E21.599 |
| 8,426,293 B2 * | 4/2013 | Tsurume | B32B 37/226 257/618 |
| 2002/0024883 A1 * | 2/2002 | Odashima | H01L 21/67144 365/52 |
| 2002/0170164 A1 * | 11/2002 | Fukuroi | G11B 5/60 29/603.07 |
| 2003/0207497 A1 | 11/2003 | Koopmans | |
| 2004/0016504 A1 * | 1/2004 | Mitarai | B29C 65/76 156/247 |
| 2004/0097054 A1 | 5/2004 | Abe | |
| 2005/0005434 A1 * | 1/2005 | Arneson | G06K 7/0095 29/829 |
| 2008/0318346 A1 | 12/2008 | Maki et al. | |
| 2009/0095418 A1 * | 4/2009 | Yamamoto | H01L 21/67132 156/712 |
| 2011/0139375 A1 * | 6/2011 | Yamamoto | H01L 21/67132 156/712 |
| 2012/0263956 A1 * | 10/2012 | Watanabe | G02F 1/133502 428/423.1 |
| 2013/0048224 A1 * | 2/2013 | George | H01L 21/67282 156/752 |

* cited by examiner

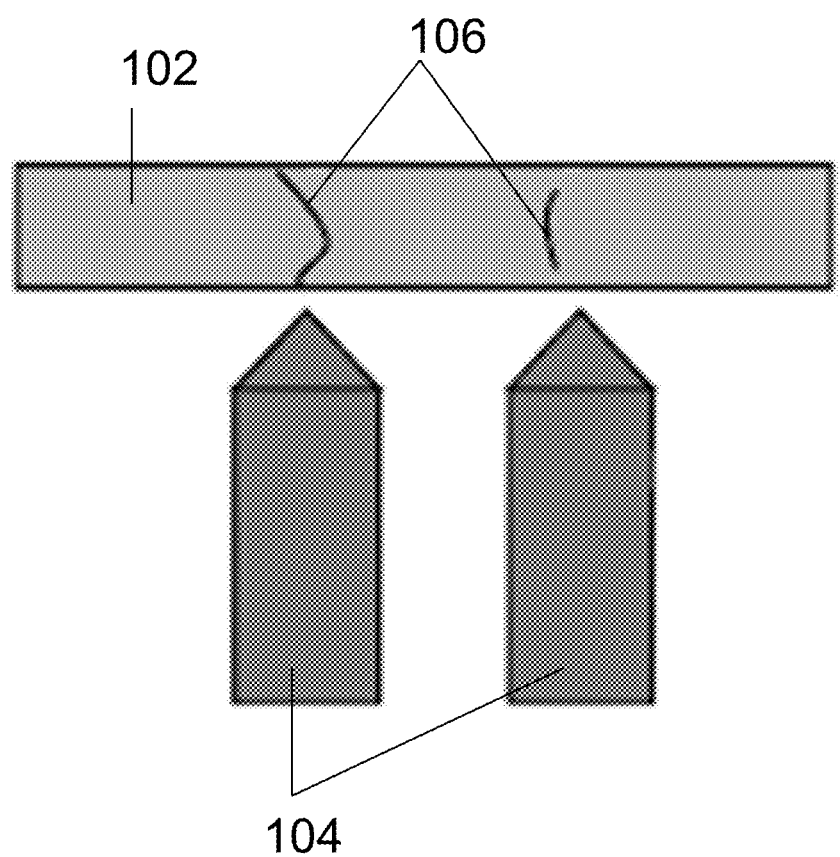

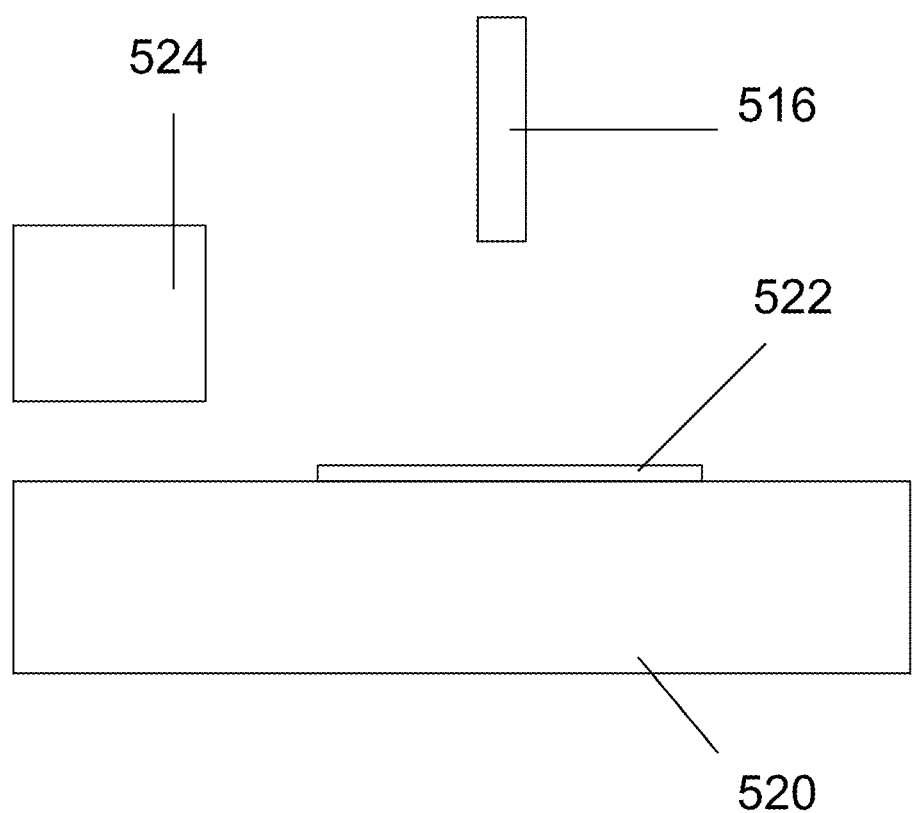

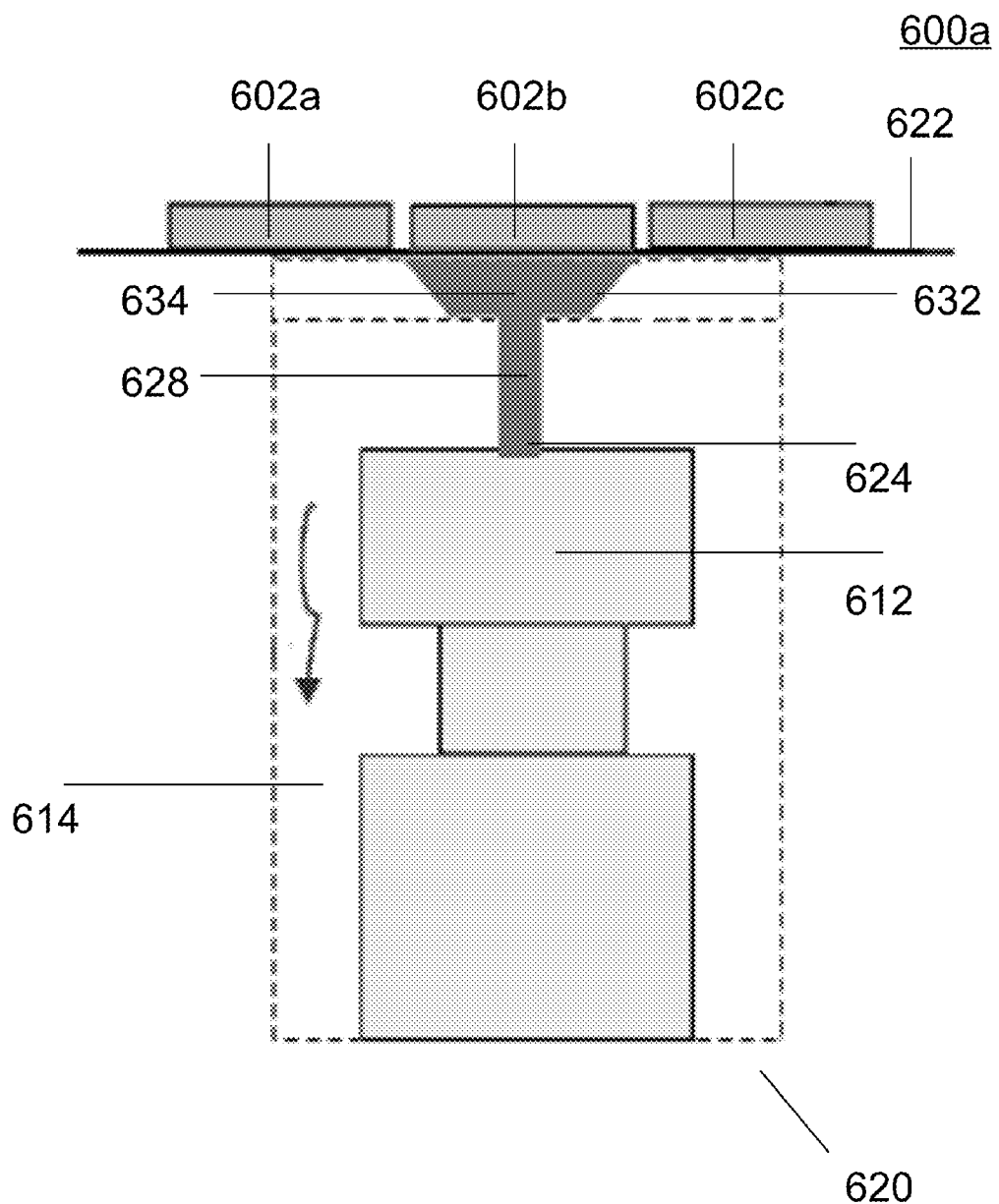

| | D-867 | Remark |
|---|---|---|
| Tape Thickness (μm) | 90 | without release film |
| Base film | Polyolefin/80 | Material / Thickness (μm) |
| Appearance | Gray | |
| Adhesive Tape | Acrylic/10 | Material / Thickness (μm) |
| Adhesion (mN/255mm) Before UV | 3900 | |
| Adhesion (mN/255mm) After UV | 70 | |

FIG. 6D
600d

| Name | Abbreviation | Wavelength range (in nanometres) | Energy per photon (in electronvolts) | Notes/ alternative names |
|---|---|---|---|---|
| Ultraviolet | UV | 400 - 100nm | 3.1 – 12.4 eV | |
| Ultraviolet A | UVA | 400 - 315nm | 3.1 – 3.94 eV | Long wave, black light, not absorbed by the ozone layer |
| Ultraviolet B | UVB | 315 – 200nm | 3.94 – 4.43 eV | Medium wave, mstly absorbed by the ozone layer |
| Ultraviolet C | UVC | 200 – 100nm | 4.43 – 12.4eV | Shortwave, completely absorbed by the ozone layer and atmosphere |
| Near Ultraviolet | NUV | 400 - 300nm | 3.10 – 4.13eV | Visible to birds, insects and fish |
| Middle Ultraviolet | MUV | 300 -200nm | 4.13 – 6.20eV | |
| Far Ultraviolet | FUV | 200 – 122nm | 6.20 -10.10eV | |
| Hydrogen Lyman-alpha | H Lyman-α | 122 – 121nm | 10.10 - 10.25eV | |
| Extreme Ultraviolet | EUV | 121 – 10nm | 10.25 - 124eV | |
| Vacuum Ultraviolet | VUV | 200 – 10nm | 6.20 – 124eV | |

628

630a  630b  630c

| 8 μm | Purple |
| 50 μm | Blue |
| 100 μm | Green |
| 200 μm | Yellow |
| 300 μm | Grey |
| 400 μm | Red |
| 500 μm | Orange |
| 600 μm | Brown |
| 1000 μm | Clear |

900 adhere the semiconductor die to an adhesive tape on a surface of a carrier, wherein the adhesive tape comprises adhesive

902 apply electromagnetic waves to the adhesive tape to reduce adhesion of the adhesive tape to the semiconductor die

904 pick up the semiconductor die from the adhesive tape when the adhesion of the adhesive tape to the semiconductor die has been reduced

906

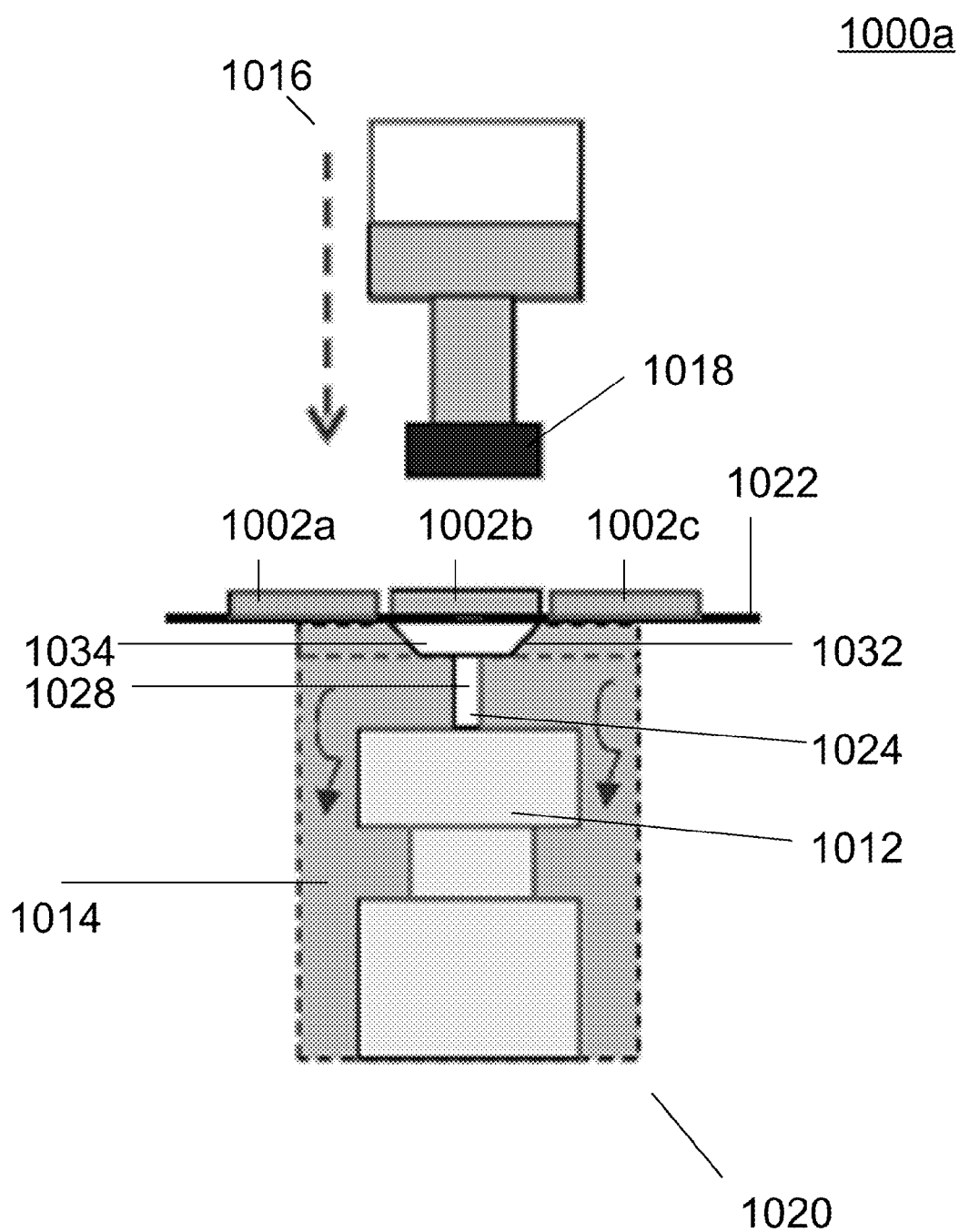

ASSEMBLY FOR HANDLING A SEMICONDUCTOR DIE AND METHOD OF HANDLING A SEMICONDUCTOR DIE

CROSS-REFERENCE TO RELATED APPLICATION

This application claims priority to German Patent Application Serial No. 10 2014 111 744.1, which was filed Aug. 18, 2014, and is incorporated herein by reference in its entirety.

TECHNICAL FIELD

Various aspects of this disclosure relate to assemblies for handling semiconductor dies as well as methods of handling semiconductor dies.

BACKGROUND

One of the main reasons of cracking in semiconductor dies is imbalance of mechanical stress applied to the die backside by the push-up or ejector needles during pickup. FIG. 1 is a schematic 100 showing a semiconductor die 102 being pushed by ejector needles 104. Force is applied by the ejector needles 104 on the backside of the semiconductor die 104. The uneven stress (caused by the ejector needles) may result in cracks 106 appearing on or within the semiconductor die 102.

SUMMARY

In various embodiments, an assembly for handling a semiconductor die is provided. The assembly may include a carrier with a surface. The assembly may also include an adhesive tape fixed to the surface of the carrier. The adhesive tape may be configured to adhere to the semiconductor die. The adhesive tape may include adhesive, the adhesion of which can be reduced by means of electromagnetic waves. The assembly may further include an electromagnetic source configured to apply electromagnetic waves to the adhesive tape to reduce adhesion of the adhesive tape to the semiconductor die. The assembly may additionally include a die pick-up component configured to pick up the semiconductor die from the adhesive tape.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic showing a semiconductor die being pushed by ejector needles;

FIGS. 3A to 3D show a method of handling semiconductor dies; wherein FIG. 3A is a schematic showing bondhead being moved from a travel height to a pick-up height; wherein FIG. 3B is a schematic showing the bondhead reaching the pick-up height; wherein FIG. 3C is a schematic showing the ejector pins protruding from the surface of the carrier; and wherein FIG. 3D is a schematic showing the semiconductor die being picked up by the bondhead as the bondhead continues to move towards the travel height;

FIG. 5 shows a schematic of an assembly for handling a semiconductor die according to various embodiments;

FIG. 6A shows a schematic of an assembly for handling a semiconductor die according to various embodiments;

FIG. 6C shows a table showing the specification of Adwill D-867;

FIG. 6D shows a table showing different types of ultraviolet (UV) light;

FIG. 9 shows a schematic showing a method of handling a semiconductor die according to various embodiments; and FIGS. 10A to 10C show illustrate a method of handling a semiconductor die according to various embodiments; wherein FIG. 10A is a schematic of a pick-up component being moved from a first position towards a second position according to various embodiments; wherein FIG. 10B is a schematic of the electromagnetic source being turned on according to various embodiments; and wherein FIG. 10C is a schematic of the semiconductor die being picked up according to various embodiments.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 2A:
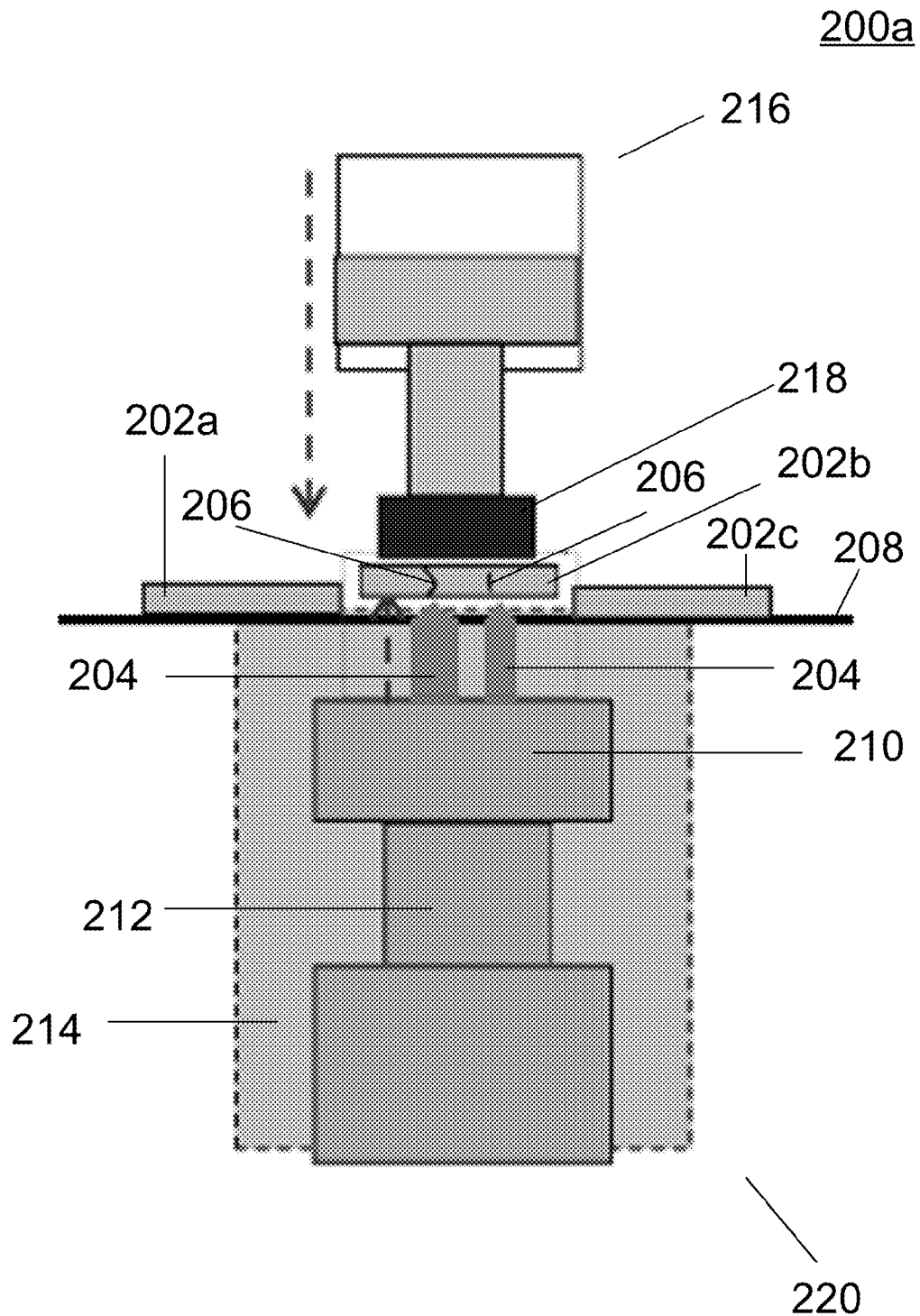
FIG. 2A shows a schematic of an assembly for picking up semiconductor dies.
Figure 2B:
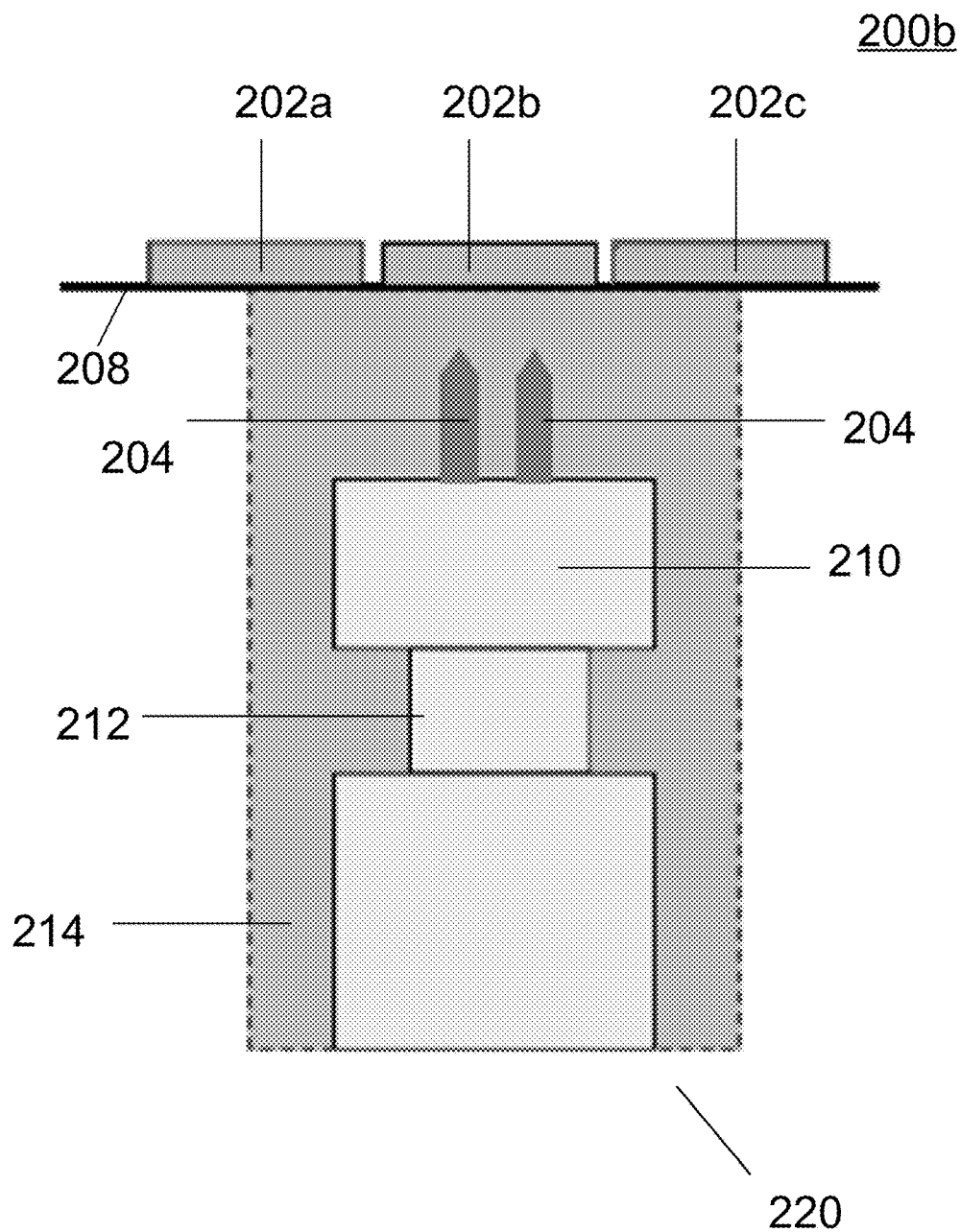
FIG. 2B shows a schematic of a part of the assembly shown in FIG. 2A.

FIG. 2A is a schematic 200a of an assembly for picking up semiconductor dies 202. FIG. 2B is a schematic 200b of a part of the assembly shown in FIG. 2A. The semiconductor dies 202a, 202b, 202c may be arranged on a wafer foil 208. The wafer foil 208 may be arranged on a surface of a carrier 220. The assembly may include ejector pins 204 on needle holder 210. The needle holder 210 may be attached to pepper pot 212. The needle holder 210 and pepper pot 212 may be arranged at least partially within a cavity 214. The cavity 214 may be formed on the surface of the carrier 220. The cavity 214 may be coupled to a vacuum generator (not shown in FIGS. 2A and 2B). As such, the assembly may have a built in on-off vacuum. The assembly may further include a pick-up tool or die pick-up component 216. The pick-up tool or die pick-up component 216 may include a bondhead 218.

Figure 3A:
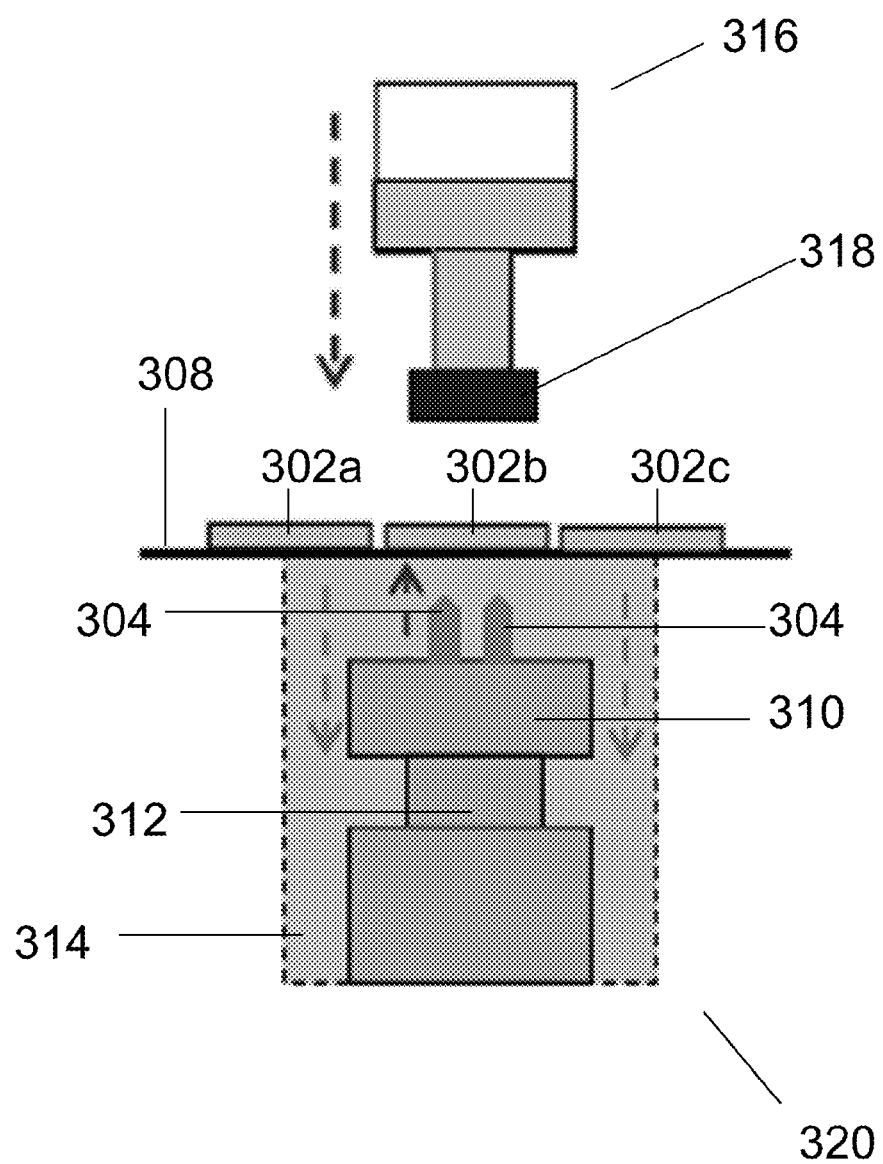

FIGS. 3A to 3D show a method of handling semiconductor dies 302a, 302b, 302c. In various embodiments, FIGS. 3A to 3D illustrate how a semiconductor die 302b of a plurality of semiconductor dies 302a, 302b, 302c is being picked up by an assembly. FIG. 3A is a schematic 300a showing bondhead 318 being moved from a travel height to a pick-up height. The bondhead 318 may be part of a pick-up tool or die pick-up component 316. The semiconductor dies 302a, 302b, 302c may be arranged on a wafer foil 308. A needle holder 310 may be attached to a pepper pot 312. Ejector pins 304 may extend from the needle holder 310. The needle holder 310, the pepper pot 312 and the ejector pins 304 may be arranged within a cavity 314 of a carrier 320. The cavity 314 may be coupled to a vacuum generator (not shown). The vacuum generator may be turned on so that the cavity 314 may include a vacuum or partial vacuum (i.e. die ejector vacuum). The wafer foil 308 may be held by the vacuum or partial vacuum to the surface of the carrier 320. The ejector pins 304 may be moved from an initial position towards foil height. In other words, the ejector pins 304 may be moved towards the wafer foil. The ejector pins 304 may be moved due to actuation of the pepper pot 312.

Figure 3B:
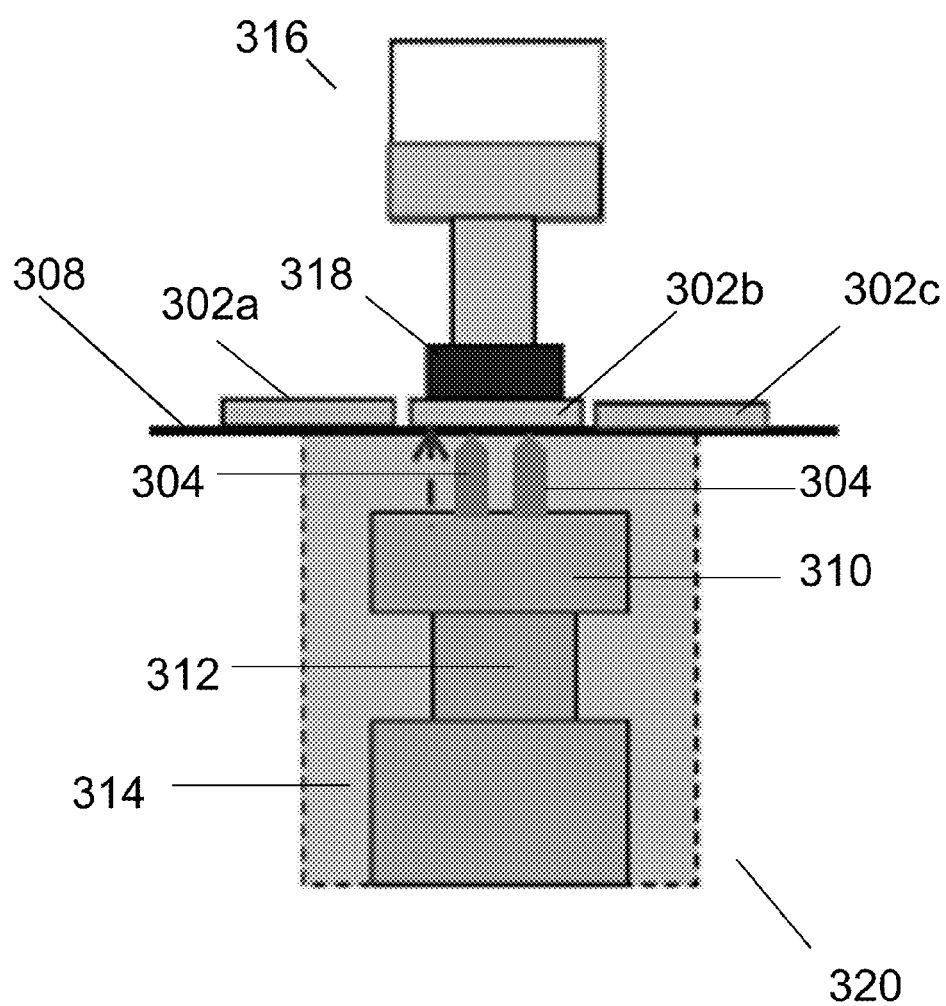

FIG. 3B is a schematic 300b showing the bondhead 318 reaching the pick-up height. The bondhead 318 may come into contact with a first surface of one of the plurality of semiconductor dies 302b. The bondhead 318 may remain at the pick-up height. The ejector pins 304 may reach the foil height (lower edge of foil 308). The ejector pins 304 may reach the foil height first before the bondhead 318 reaches the pick-up height. The bondhead 318 may be configured to attach to the semiconductor die being 302b using a suction force. The pick-up tool or die pick-up component 316 may include a pneumatic bondhead cylinder (not shown) to generate the suction force.

Figure 3C:
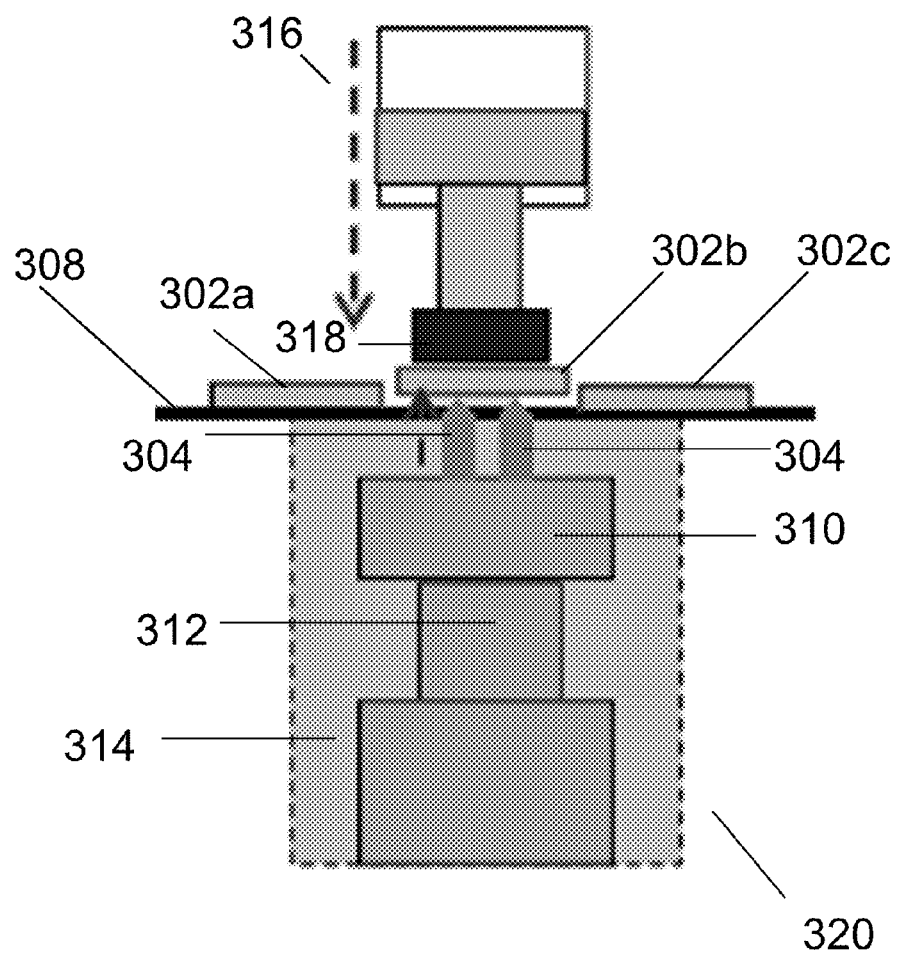

FIG. 3C is a schematic 300c showing the ejector pins 304 protruding from the surface of the carrier 320. The ejector pins 304 may move towards the pick-up tool or die pick-up component 316 while the bondhead 318 is still at the pick-up height. The ejector pins 304 may push against a second surface of the semiconductor die 302b. Due to the continuing motion of the ejector pins 304 and due to a constant reaction force caused by the pressure applied in the pneumatic bondhead cylinder, the tool tip of the bondhead 318 may be deflected. The semiconductor die 302b may thus be clamped firmly between the ejector pins 304 and the bondhead 318 of the pick-up tool or die pick-up component 316. When the ejector pins 304 are moved to a maximum height, the bondhead 318 may start to move back towards the travel height. However, as the pressure is still relatively constant, the bondhead 318 may still be deflected. Cracks may on the semiconductor die 302b caused by the ejector needle at this stage. In other words, the semiconductor die 302b may suffer from cracks due to the uneven stress caused by the ejector pins 304.

Figure 3D:
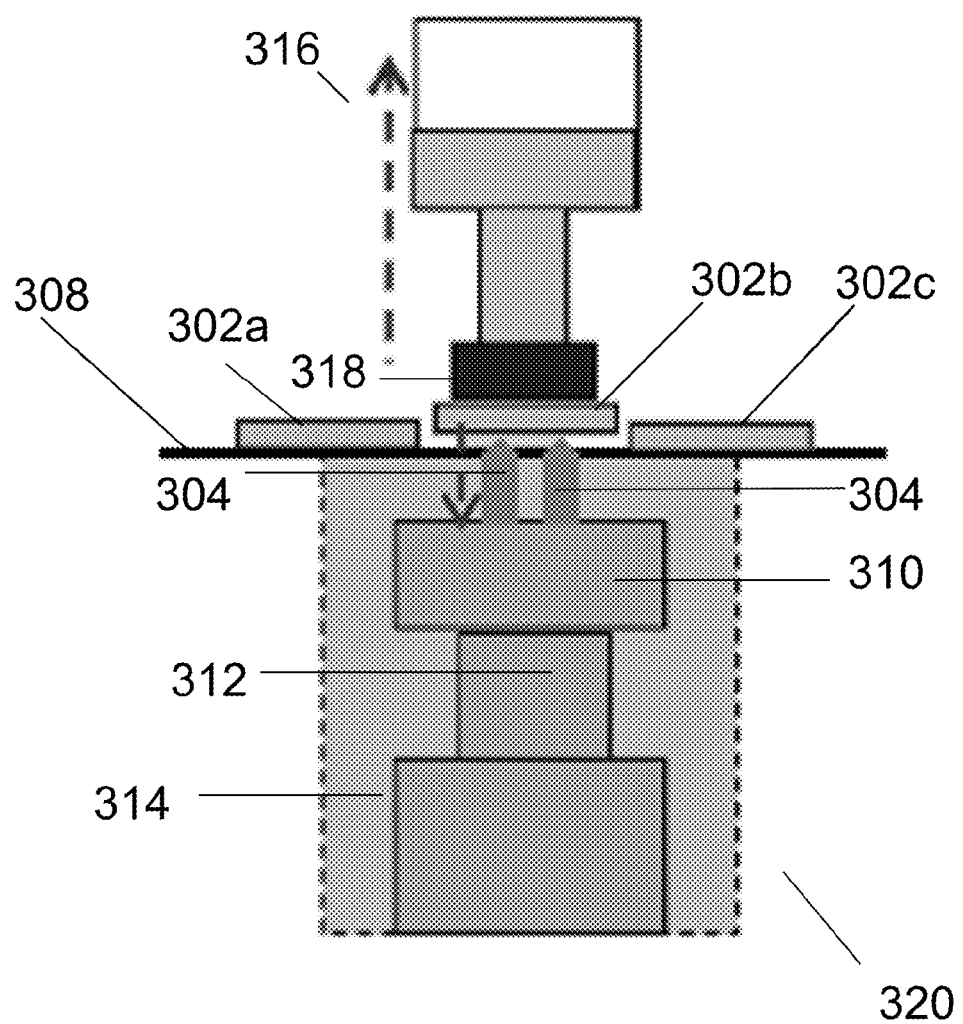

FIG. 3D is a schematic 300d showing the semiconductor die 302b being picked up by the bondhead 318 as the bondhead 318 continues to move towards the travel height. As the bondhead 318 continues movement along the z-direction towards the travel height, the tool tip of the bondhead may no longer be deflected as the force exerted on the semiconductor die 302b being picked up decreases rapidly to zero. The semiconductor die 302b may be separated from the foil 308. The ejector needles 304 may be moved back to the initial position from the foil height. The carrier may be moved to align to the next die e.g. 302a or 302c.

In practice, cracks are more likely to occur due one or more of the following reasons: (1) wrong needle configuration; (2) wrong needle type; (3) worn-out needle; (4) non-level needle tips; (5) pick-up height of the bondhead too high; (6) sensitive or fragile semiconductor dies/silicon chips; and (7) thin semiconductor dies.

Various measures have been proposed to address the problem of cracks occurring in semiconductor dies but without much success. Methods include aligning the ejector needles using a jig during every setup or conversion, monitoring needles with indentations (reject with indentation marks) and parameter controls such as controlling the pick-up height of the bondhead.

Current detection methods may include 100% Front-Of-Line Auto Vision (FAV) which capture visible die cracks on top surface of dies only, and 100% electrical test which detect units with die cracks as well as units with non-visible but electrically failed cracks. As such, current detection methods may only detect semiconductor dies with visible cracks or semiconductor dies with non-visible cracks but electrically failed cracks. Semiconductor dies with hairline cracks and which pass the electrical testing may not be detected by using these methods.

Various embodiments may reduce or eliminate the problem of cracks occurring in semiconductor dies. Various embodiments may improve yield of semiconductor dies.

Figure 4:
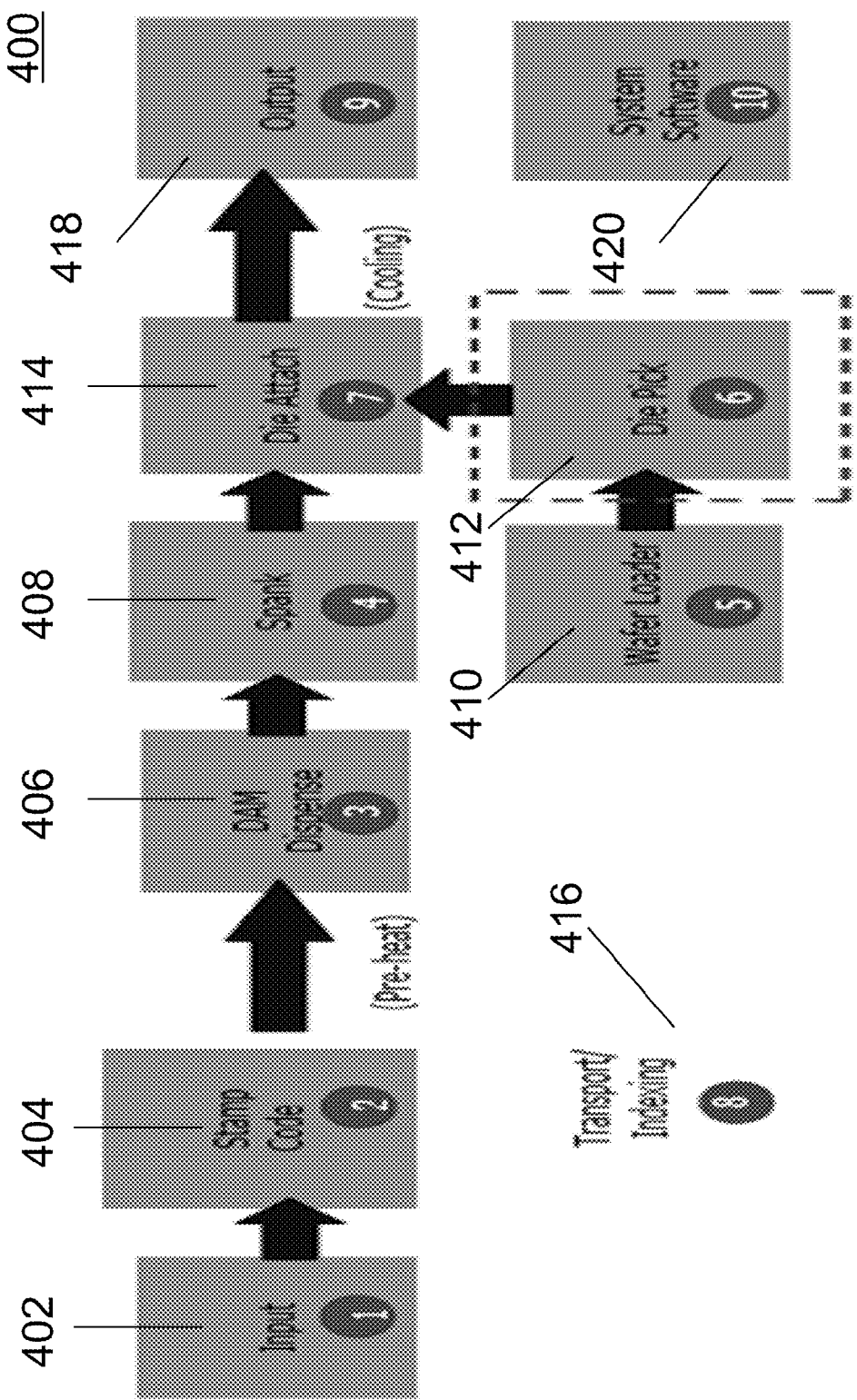
FIG. 4 shows a schematic of a die bond process.

FIG. 4 shows a schematic 400 of a die bond process. A carrier is provided in 402. The carrier then undergoes a stamp code process in 404, a dam dispense process in 406 to define an area for coating the carrier with a protective layer and a spank process in 408 for depositing and flattening solder, adhesive etc. A wafer may be loaded into a wafer loader in 410. The wafer may be diced into a plurality of dies. A die pick process 412 may be used to pick up individual dies and attach the individual dies to the carrier in the die attach process in 414. The process may further include transport and indexing in 416 to form an assembly in 418. The assembly may include a carrier attached to a die. The process may also include system software 420 to control and automate the process flow.

Various embodiments described herein may relate to the die pick process in 412. Various embodiments described herein may cover various die attach technologies such as soft solder, solder paste, epoxy/glue, diffusion, die attach films (DAF)/conductive die attach films (CDAF), flip chips and others that require pick-up process.

FIG. 5 shows a schematic 500 of an assembly for handling a semiconductor die according to various embodiments. The assembly may include a carrier 520 with a surface. The assembly may also include an adhesive tape 522 fixed to the surface of the carrier 520. The adhesive tape 522 may be configured to adhere to the semiconductor die. The adhesive 522 may include adhesive, the adhesion of which can be reduced by means of electromagnetic waves. The assembly may further include an electromagnetic source 524 configured to apply electromagnetic waves to the adhesive tape 522 to reduce adhesion of the adhesive tape 522 to the semiconductor die. The assembly may additionally include a die pick-up component 516 configured to pick up the semiconductor die from the adhesive tape 522.

In other words, an assembly for picking up a semiconductor die may be provided. The assembly may include a carrier 520 on which an adhesive tape 522 is mounted. The adhesive tape 522 may have adhesive. The tape 522 may be adhered to the semiconductor die via the adhesive. The assembly may also include an electromagnetic source 524 configured to emit electromagnetic waves. The adhesive may be configured so that the adhesion of the adhesive may be reduced or decreased by the electromagnetic waves. The assembly may further include a die pick-up component 516 configured to separate the semiconductor die from the adhesive tape 522 after the adhesion of the adhesive has been reduced.

By changing the ejector pins or needles to a non-contact means, i.e. using adhesive and electromagnetic source 524 to reduce adhesion of the adhesive, for facilitating the pick-up component 516 in die pick-up, the problem of die cracking in the die pick-up step may be eliminated or reduced. Mechanical stress from the ejector pins or needles to the backside of the semiconductor die, which causes die cracks, may be removed. The semiconductor die may be picked using suction or other means from the die pick-up component after adhesion to the tape 522 is reduced by the electromagnetic waves.

The adhesive tape 522 may include or essentially consist of a wafer foil tape or an ultraviolet (UV) tape such as an UV curable dicing tape. The adhesive tape 522 may include or essentially consist of adhesive within the tape 522 or on one or both surface of the tape 522. The adhesion of the adhesive may be reduced by electromagnetic waves. In contrast, the wafer foils 208, 308 in FIGS. 2A to 2B as well as FIGS. 3A to 3D may be devoid of adhesive that has an adhesion reduced by electromagnetic waves. In various embodiments, the electromagnetic source 524 may be configured to apply UV light or laser to the tape 522 and the adhesion of the tape 522 may be reduced by the UV light or laser. By applying UV light or laser in the pick-up stage, UV curing may be done in the pick-up stage rather than an off-line process. Issues on staging (UV cure to diebond) may be eliminated or reduced. The removal of a sub process (i.e. UV cure) may also result in costs savings. The electromagnetic source may be an ultraviolet lamp or a laser diode such as a UV laser diode.

However, adhesion of the adhesive may alternatively be reduced or decreased by other components of the electromagnetic spectrum and the electromagnetic source 524 may be configured to apply or emit such components of the electromagnetic waves accordingly. For instance, the tape 522 may include an adhesive, wherein the adhesion of the adhesive may be reduced by infra red radiation and the electromagnetic source 524 may be configured to apply infra red radiation to the tape including such an adhesive. In another instance, the tape 522 may include an adhesive in which adhesion may be reduced by visible optical light and the electromagnetic source 524 may be configured to apply visible optical light to the tape. The electromagnetic waves may be one or more of a group consisting of radio waves, microwaves, infrared radiation, visible optical light, UV light, X-ray and gamma rays.

In various embodiments, the electromagnetic source 524 may be configured to apply electromagnetic waves, the electromagnetic waves including a plurality of wavelength components, to the tape 522, in which adhesion of the adhesive is reduced by only one or few (but not all) wavelength components. In various embodiments, the adhesion of the adhesive may be reduced by a predetermined range of wavelengths of the electromagnetic waves and the electromagnetic source 524 may be configured to apply or emit electromagnetic waves including wavelengths corresponding to, including, or overlapping the predetermined range of wavelengths.

In various embodiments, the adhesive tape 522 may be replaced by any suitable material including the adhesive. For instance, instead of a tape 522, a gel or paste or glue including the adhesive may alternatively be applied to the surface of the carrier 520.

In various embodiments, the adhesion of the adhesive tape 522 (to the die) may be reduced from a first level to a second level after the adhesive tape 522 is exposed to the electromagnetic waves.

In various embodiments, the surface of the carrier 520 may include a cavity. The adhesive tape 522 may extend across an opening of the cavity on the surface of the carrier 520. The electromagnetic source 524 may be arranged above the carrier 520 as shown in FIG. 5 or may be arranged within the cavity of the carrier 520.

The assembly may further include an optical fiber coupling the electromagnetic source 524 to the cavity. The optical fiber may be configured to direct the electromagnetic waves from the source 524 to the cavity for applying to the tape 522.

The cavity may also include an optical reflector for directing electromagnetic radiation to the adhesive tape 522. The backside (back surface) of the semiconductor die may be adhered to the tape 522. The optical reflector may be configured to direct electromagnetic waves over a wider area of the tape 522 adhering to the die. As such, the optical reflector may help reduce adhesion of the portion of the tape 522 adhering to the die in a more even manner. The adhesion of the entire portion of the tape 522 adhered to the die may be more evenly reduced, facilitating subsequent removal of the die from the tape 522.

Additionally or alternatively, the assembly may include a lens arranged between the electromagnetic source and the adhesive tape. The lens may be a convergent lens, the lens configured to converge divergent beams emitted from the electromagnetic source onto the tape 522 adhered to the die. The lens may instead be a divergent lens, the lens configured to diverge electromagnetic waves emitted from the electromagnetic source 524. The lens may also be configured to direct electromagnetic waves over a wider area of the tape 522 adhering to the die. The adhesion of the entire portion of the tape 522 adhered to the die may be more evenly reduced, facilitating subsequent removal of the die from the tape 522.

The assembly may further include a vacuum generator coupled to the cavity. The vacuum generator may be configured to generate a suction force for holding the adhesive tape to the surface of the carrier 520 when the semiconductor die is separated from the adhesive tape 522. In various embodiments, this makes the separation of the semiconductor die from the tape 522 easier.

The die pick-up component 516 may be configured to move from a first position to a second position to attach to the semiconductor die and further configured to move from the second position to the first position to separate the semiconductor die from the adhesive tape 522. The die pick-up component may be or may include a bondhead. When the die pick-up component 516 is at the first position, the bondhead may be at the travel height and when the die pick-up component 516 is at the second position, the bondhead may be at the pick-up height.

The die pick-up component 516 may be configured to pick up the die via a force such as suction force. The die pick-up component 516 may be coupled to or may include a vacuum generator (or pneumatic bondhead cylinder) configured to generate a vacuum. The vacuum may cause the die to be attached to the die pick-up component via suction force.

In general, the force attaching the die to the die pick-up component 516 may be greater than the adhesion of the die to the tape 522 after the adhesion of the tape 522 has been reduced by the electromagnetic waves (i.e. the second level of adhesion) for the die pick-up component 516 to separate the die from the tape 522. Prior to the reduction in adhesion of the tape 522 to the die, the force attaching the die to the die pick-up component 516 may be smaller than the adhesion of the die to the tape 522.

The die pick-up component 516 may alternatively or additionally be configured to pick up the die via other suitable forces such as magnetic force. The die pick-up component 516 may be configured to generate a magnetic field which attaches the die to the pick-up component via a magnetic force.

The carrier 520 may include glass or any other suitable material. The carrier 520 may be made of a material that has a reduced outgasing effect in order to prevent loss of vacuum.

FIG. 6A shows a schematic 600a of an assembly for handling a semiconductor die 602b according to various embodiments. The assembly may include a carrier 620 with a surface. The assembly may also include an adhesive tape 622 fixed to the surface of the carrier 620. The adhesive tape 622 may be configured to adhere to the semiconductor die. The adhesive 622 may include adhesive, the adhesion of which can be reduced by means of electromagnetic waves. The assembly may further include an electromagnetic source 624 configured to apply electromagnetic waves to the adhesive tape 622 to reduce adhesion of the adhesive tape 622 to the semiconductor die 602b. The assembly may additionally include a die pick-up component (not shown) configured to pick up the semiconductor die from the adhesive tape 622.

As shown in FIG. 6A, the semiconductor die 602b may be one of a plurality of semiconductor dies 602a, 602b, 602c. The plurality of semiconductor dies 602a, 602b, 602c may be arranged on the adhesive tape 622 and the plurality of semiconductor dies 602a, 602b, 602c may be adhered on to the adhesive tape 622. The plurality of semiconductor dies may be diced or cut from a single wafer in a previous processing step, i.e. a dicing process. The plurality of semiconductor dies 602a, 602b, 602c may be silicon chips.

The die pick-up component may be configured to move from a first position to a second position to attach to the semiconductor die 602b and may be further configured to move from the second position to the first position to separate the semiconductor die 602b from the adhesive tape 622.

The adhesive tape may be or may include a wafer foil or a UV tape. The adhesive tape may include adhesive on a first side of the tape 622 so that the backside of the semiconductor dies may be adhered to the first side of the tape 622. The adhesive tape 622 may further include adhesive on a second side of the tape 622. The adhesive tape 622 may alternatively include adhesive within the tape 622.

Figure 6B:
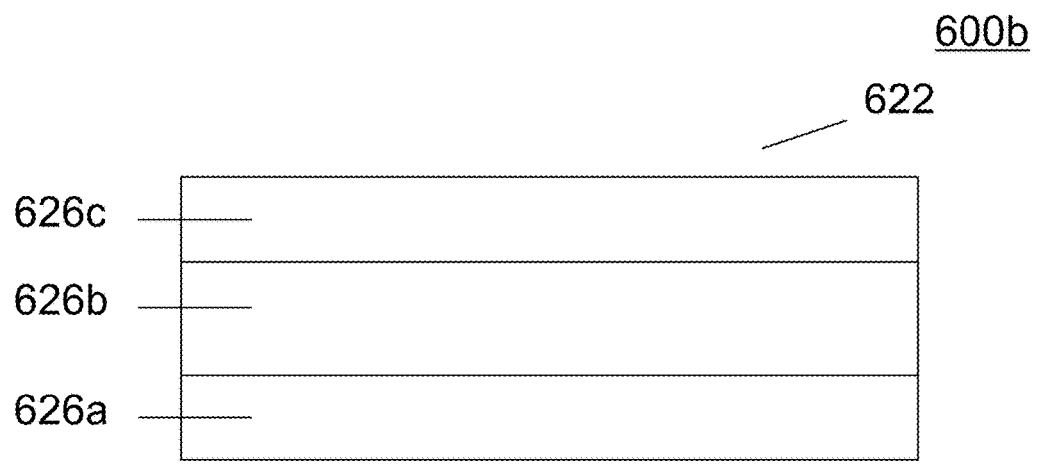
FIG. 6B shows a schematic of an adhesive tape according to various embodiments.

FIG. 6B shows a schematic 600b of an adhesive tape 622 according to various embodiments. The adhesive tape 622 may be a UV curable dicing tape such as Adwill D-867 from Lintec Corporation. The adhesive tape 622 may include a release film 626a. The release film 626a may include polyester. The adhesive tape 622 may also include an adhesive layer 626b on the release film 626a. The adhesive layer 626b may include UV curable acrylic. The adhesive tape 622 may also include a base film 626c on the adhesive layer 626b. The base film 626c may include polyolefin. The release film 626a may be removed before the tape 622 is adhered to the semiconductor dies 602a, 602b, 602c.

FIG. 6C shows a table 600c showing the specification of Adwill D-867. As illustrated in FIG. 6C, the adhesion of the tape 622 before UV exposure may be 3900 mN/25 mm but may decrease to 70 mB/25 mm after UV exposure.

Referring back to FIG. 6A, the surface of the carrier 620 includes a cavity 614. The carrier 620 may include the cavity 614 which extends to the surface of the carrier 620, i.e. the surface of the carrier in which the tape 622 is fixed to.

The adhesive tape 622 may extend across an opening of the cavity 614 on the surface of the carrier 620. The electromagnetic source 624 may be arranged within the cavity 614. As shown in FIG. 6A, the electromagnetic source 624 may be arranged directly below the adhesive tape 622 and directed towards the adhesive tape 622 extending across the opening. The electromagnetic source 624 may be a laser source. The assembly may also include a pepper pot 612. The electromagnetic source 624 may be arranged on the pepper pot 612. The pepper pot 612 may also be arranged at least partially within the cavity.

It may also be envisioned that the electromagnetic source 624 may be positioned or arranged at any other suitable position, such as above the carrier 620. The electromagnetic source 624 may be directed directly towards the adhesive tape 622 or may be directed at a reflecting or directing component, which reflects or directs electromagnetic waves from the electromagnetic source 624 towards the tape 622.

The electromagnetic source 624 may be configured to apply electromagnetic waves including ultraviolet light to the adhesive tape 622. The electromagnetic source 624 may be a UV source or may be any source that emits suitable electromagnetic waves that is capable of decreasing adhesion of the adhesive tape 622.

FIG. 6D is a table 600d showing different types of ultraviolet (UV) light. UV light may be electromagnetic radiation with a wavelength shorter than that of visible light but longer than X-rays, that is, in the range between about 400 nm to about 10 nm and may correspond to photon energies from about 3 eV to about 124 eV. A suitable type of electromagnetic waves may be ultraviolet A (UVA), which has a wavelength range from about 400 to about 315 nm and an energy (per photon) of about 3.1 to about 3.94 eV. UVA may not be easily absorbed by the atmosphere and ozone layer. The electromagnetic waves may in various embodiments be UV wavelength 365 nm Class A.

Figures 6E, 6F:
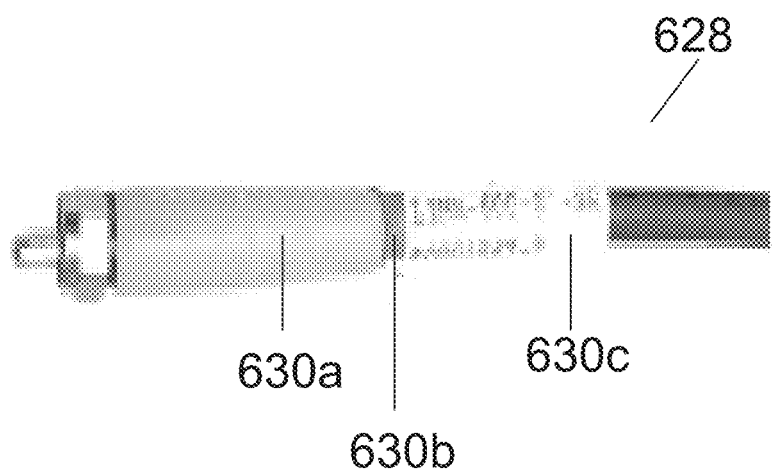
FIG. 6E shows an image of an optical fiber according to various embodiments.
FIG. 6F shows a table illustrating correspondence of the band colour of an optical fiber and the diameter of the fiber.

The assembly may further include an optical fiber 628 coupling the electromagnetic source 624 to the cavity 614. FIG. 6E is an image 600e of an optical fiber 628 according to various embodiments. The optical fiber 628 may include a boot collar 630a. The boot collar 630a colour may correspond to the assembly's fiber type (and the most efficient wavelength range). The optical fiber 628 may further include a band colour label 630b, which signals or indicates the diameter of the (optical fiber) assembly's core.

The optical fiber 628 may also have a white product label 630c on the optical fiber assembly which includes the product name and item code.

The band colour may provide information on the fiber type and the most efficient wavelength range in which the fiber will work. FIG. 6F is a table 600f illustrating correspondence of the band colour of an optical fiber 628 and the diameter of the fiber 628. For instance, purple indicates a 8 μm fiber; blue indicates a 50 μm fiber; green indicates a 100 μm fiber; yellow indicates a 200 μm fiber; gray indicates a 300 μm fiber; red indicates a 400 μm fiber; orange indicates a 500 μm fiber; brown indicates a 600 μm fiber and clearly indicates a 1000 μm fiber.

The assembly may further include a vacuum generator (not shown in FIG. 6A) coupled to the cavity 614. The vacuum generator may be configured to generate a suction force for holding the adhesive tape to the surface of the carrier when the semiconductor die is separated from the adhesive tape. In other words, the adhesive tape 622 may be fixed to the surface of the carrier 620 by the suction force generated by the vacuum generator. Additionally or alternatively, the adhesive tape 622 may be fixed to the surface of the carrier 620 via other means, such as adhesive on the second side of the tape 622 or fastening components such as clips, other tapes etc.

The optical fiber 628 may alternatively be coupled to a further cavity 634. In other words, the optical fiber 628 may be coupled to the same cavity as the vacuum generator is coupled to or may be coupled to a separate cavity (not connected to the cavity). For avoidance of doubt, the optical fiber 628 and the vacuum generator coupled to the same cavity may also refer to the optical fiber 628 and the vacuum generator coupled to different but interconnected chambers. The further cavity 634 may be within the cavity 614.

The cavity 614 may include an optical reflector 632 for directing electromagnetic radiation from the electromagnetic source 624 to the adhesive tape 622. Electromagnetic waves from the optical fiber 628 may be coupled to the optical reflector 632. The optical reflector 632 may be arranged on an inner wall of the cavity 614 or further cavity 634. In various embodiments, the optical reflector 632 may separate the further cavity 634 from the cavity 614.

The optical reflector 632 may form a funnel, the funnel having a narrow first opening and a wide second opening. The first opening may be coupled to the electromagnetic source 624, for instance directly or via optical fiber 628. The adhesive tape 622 may extend over the second opening. The second opening may have an area substantially equal to an area defined by the backside of the semiconductor die 602b. By having the second opening having an area defined by the backside of the semiconductor die 602b, electromagnetic waves may be applied to a portion of the adhesive tape 622 directly adhered to the backside of the die 602b. The adhesion of the portion of the adhesive tape 622 directly adhered to the backside of the die 602b may be evenly reduced. This may reduce the likelihood of parts of the adhesive tape still having strong adhesion to the die 602b when the die 602b is picked up by the die pick-up component and may allow the semiconductor die 602b to be more easily picked up by the die pick-up component. Further, adhesion of the other semiconductor dies 602a, 602c to the tape 622 may not affected (i.e. may remain substantially unchanged) as the portion of the tape adhered to the other semiconductor dies 602a, 602c falls outside the second opening of the funnel. As such, the other semiconductor dies 602a, 602c may still be secured to the tape 622.

Figure 7A:
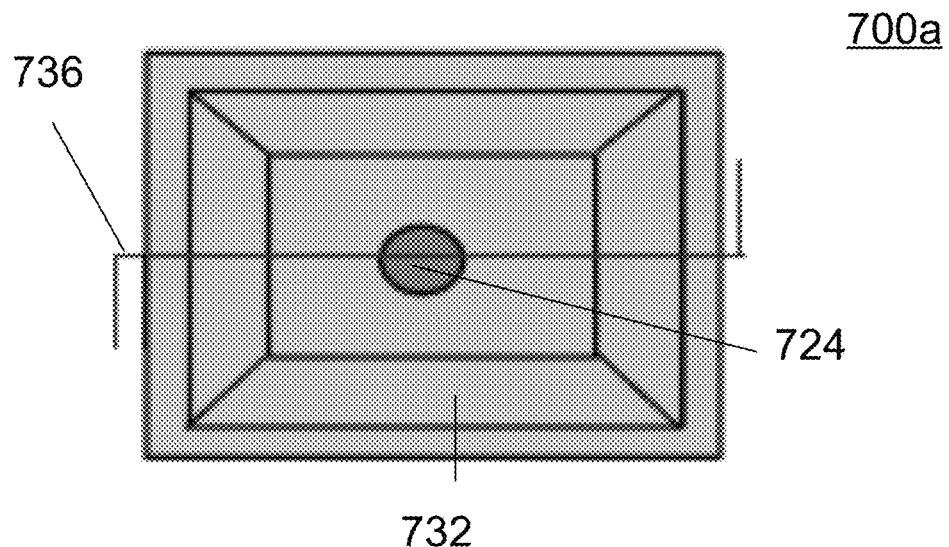
FIG. 7A shows a schematic showing a top planar view of an optical arrangement of the assembly according to various embodiments.
Figure 7B:
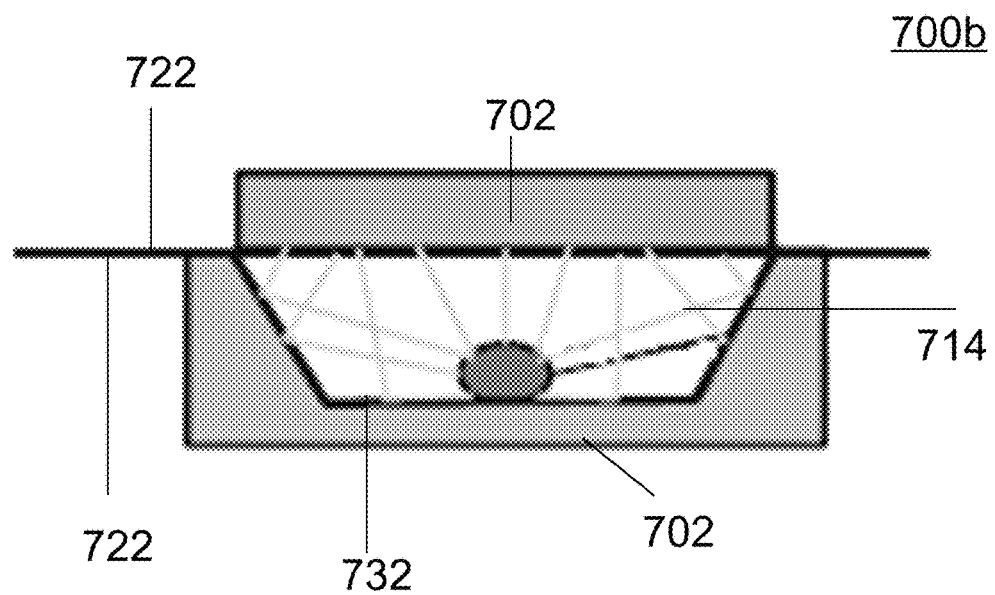
FIG. 7B shows a schematic showing a cross-sectional side view of the optical arrangement shown in FIG. 7A according to various embodiments.

FIG. 7A is a schematic 700a showing a top planar view of an optical arrangement of the assembly according to various embodiments. FIG. 7B is a schematic 700b showing a cross-sectional side view of the optical arrangement shown in FIG. 7B according to various embodiments. FIG. 7B may correspond to the cross-sectional view of the optical arrangement as indicated by line 736 in FIG. 7A. The assembly may include a carrier 720 with a cavity 714 on a surface of the carrier 720. The assembly may further include an adhesive tape 722. The tape 722 may extend across an opening of the cavity 714. The assembly may include an optical arrangement. The optical arrangement may include electromagnetic source 724 and optical reflector 732. The electromagnetic source 724 may be within the cavity 714. A vacuum generator may be coupled to the cavity 714. The assembly shown in FIGS. 7A and 7B may be without an optical fiber. The electromagnetic source 724 may be or may include a UV lamp.

The optical reflector 732 may be arranged on an inner wall of the cavity 714. The optical reflector 732 may be configured to direct electromagnetic radiation to the adhesive tape 722. The opening of the cavity 714 may correspond to an area defined by the backside of semiconductor die 702. As the optical reflector 732 is configured to direct electromagnetic radiation to a portion of the adhesive tape 722 over the opening and the portion of the adhesive tape 722 is directly adhered to the entire backside of the die 702, the adhesion of the portion of the tape adhered to the backside of the die 702 may be evenly reduced. In other words, the reduction in adhesion of the portion of the tape adhered to the die 702 may be substantially even.

Figure 8:
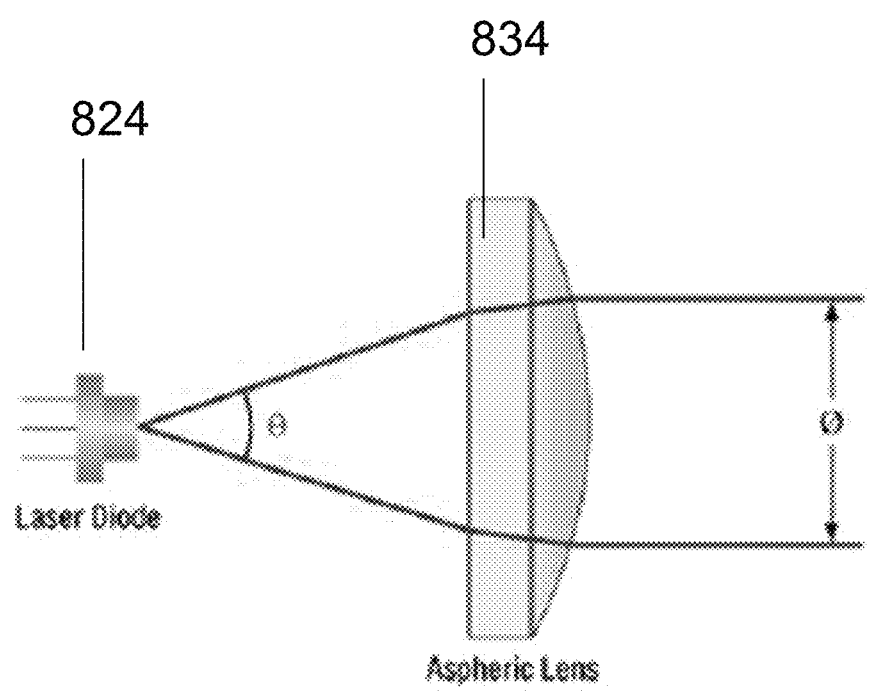
FIG. 8 shows a schematic showing a cross-sectional view of an optical arrangement of the assembly according to various embodiments.

FIG. 8 is a schematic 800 showing a cross-sectional view of an optical arrangement of the assembly according to various embodiments. The assembly may also include a lens 838 arranged between the electromagnetic source 824 and the adhesive tape. The lens 838 may be an aspheric lens. An aspheric lens may be a lens whose surface profile is not portions of a sphere or a cylinder. The electromagnetic source 824 may be a laser or a laser diode such as a UV laser diode. Alternatively, the electromagnetic source 824 may be a beam or a laser with a separate UV light source. A laser (also known as light amplification by simulated emission of radiation) may be defined as a device that emits light through a process of optical amplification based on the simulated emission of electromagnetic radiation. Light may be broadly defined by electromagnetic radiation or waves of any frequency or wavelength. A laser may include infra red laser, ultraviolet laser, X-ray laser in addition to visible light laser. The lens 838 may be a convergent lens and may be configured to converge the divergent electromagnetic waves emitted from the electromagnetic source 824 on the adhesive tape adhered to the semiconductor die. The lens 838 may alternatively be a divergent lens and may be configured to diverge electromagnetic waves emitted from the electromagnetic source 824.

FIG. 9 is a schematic 900 showing a method of handling a semiconductor die according to various embodiments. The method may include, in 902, adhering the semiconductor die to an adhesive tape on a surface of a carrier. The adhesive tape may include adhesive, the adhesion of which may be reduced by means of electromagnetic waves. The method may also include, in 904, applying electromagnetic waves to the adhesive tape using an electromagnetic source to reduce adhesion of the adhesive tape to the semiconductor die. The method may further include, in 906, picking up the semiconductor die from the adhesive tape when the adhesion of the adhesive tape to the semiconductor die has been reduced.

In other words, a method of picking up a semiconductor die may be provided. The method may include adhering the semiconductor die to a carrier using an adhesive tape. The method may further include applying electromagnetic waves to reduce adhesion of the tape to the die. The method may also include picking up the die from the tape.

In various embodiments, the semiconductor die may be first adhered to the tape as part of a wafer. The wafer may then be further processed, such as diced or cut into a plurality of semiconductor dies. Electromagnetic waves may be applied to reduce adhesion of a portion of the adhesive tape adhered to a particular die so that the particular die may be picked up. In other words, the semiconductor die may be one of a plurality of semiconductor dies diced or cut from a semiconductor wafer In various embodiments, the adhesive tape may be provided on the surface on the carrier before the semiconductor die is adhered to the adhesive tape. In various alternate embodiments, the adhesive tape may be adhered to the semiconductor die before the adhesive tape and the semiconductor die are provided on the surface of the carrier.

The surface of the carrier may include a cavity. The adhesive tape may extend across an opening of the cavity. The electromagnetic source is arranged within the cavity. An optical fiber may be coupled between the electromagnetic source and the cavity. The cavity may include an optical reflector for directing electromagnetic radiation to the adhesive tape. The optical reflector is arranged on an inner wall of the cavity.

Alternatively or additionally, a lens may be arranged between the electromagnetic source and the adhesive tape. In various embodiments, the lens may be a convergent lens, the lens configured to converge divergent electromagnetic waves from the electromagnetic source onto the adhesive tape or portion of the adhesive tape in which the semiconductor die is adhered to. In various alternate embodiments, the lens may be a divergent lens, the lens configured to diverge electromagnetic waves emitted from the electromagnetic source onto the adhesive tape or portion of the adhesive tape in which the semiconductor die is adhered to.

The method may further include generating a suction force for holding the adhesive tape to the surface of the carrier when the semiconductor die is separated from the adhesive tape. The suction force may be generated by a vacuum generator.

Picking up the die may be done by a die pick-up component. The method may include moving the die pick-up component from a first position to a second position to attach to the semiconductor die. The method may further include moving from the second position to the first position to separate the semiconductor die from the adhesive tape.

The electromagnetic source may be a lamp or a laser diode. The electromagnetic waves may include ultraviolet (UV) light or any other suitable components from the electromagnetic spectrum. The electromagnetic source may be an ultraviolet lamp or a UV laser diode for emitting the UV light. The carrier may include glass.

Figure 10B:
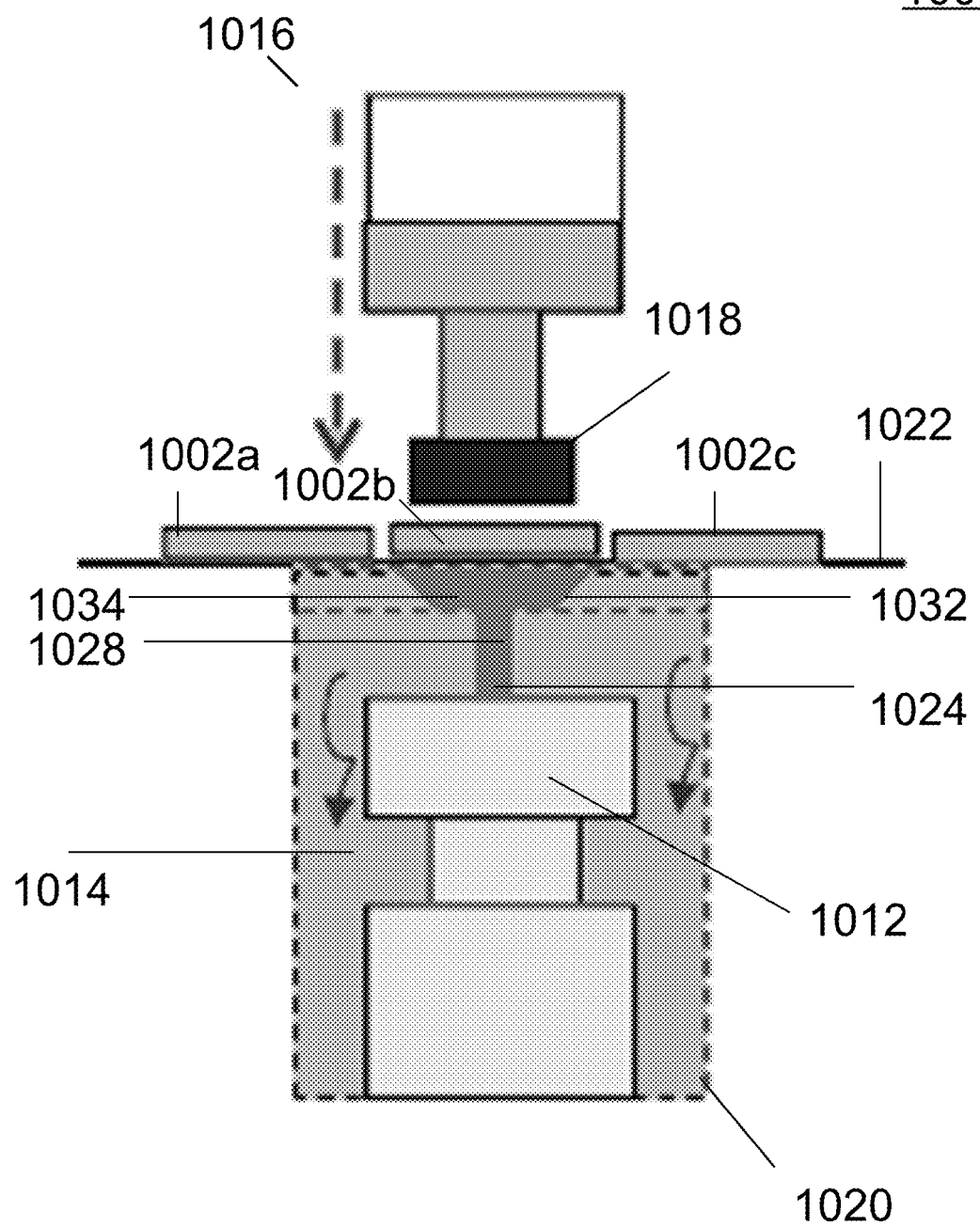
Figure 10C:
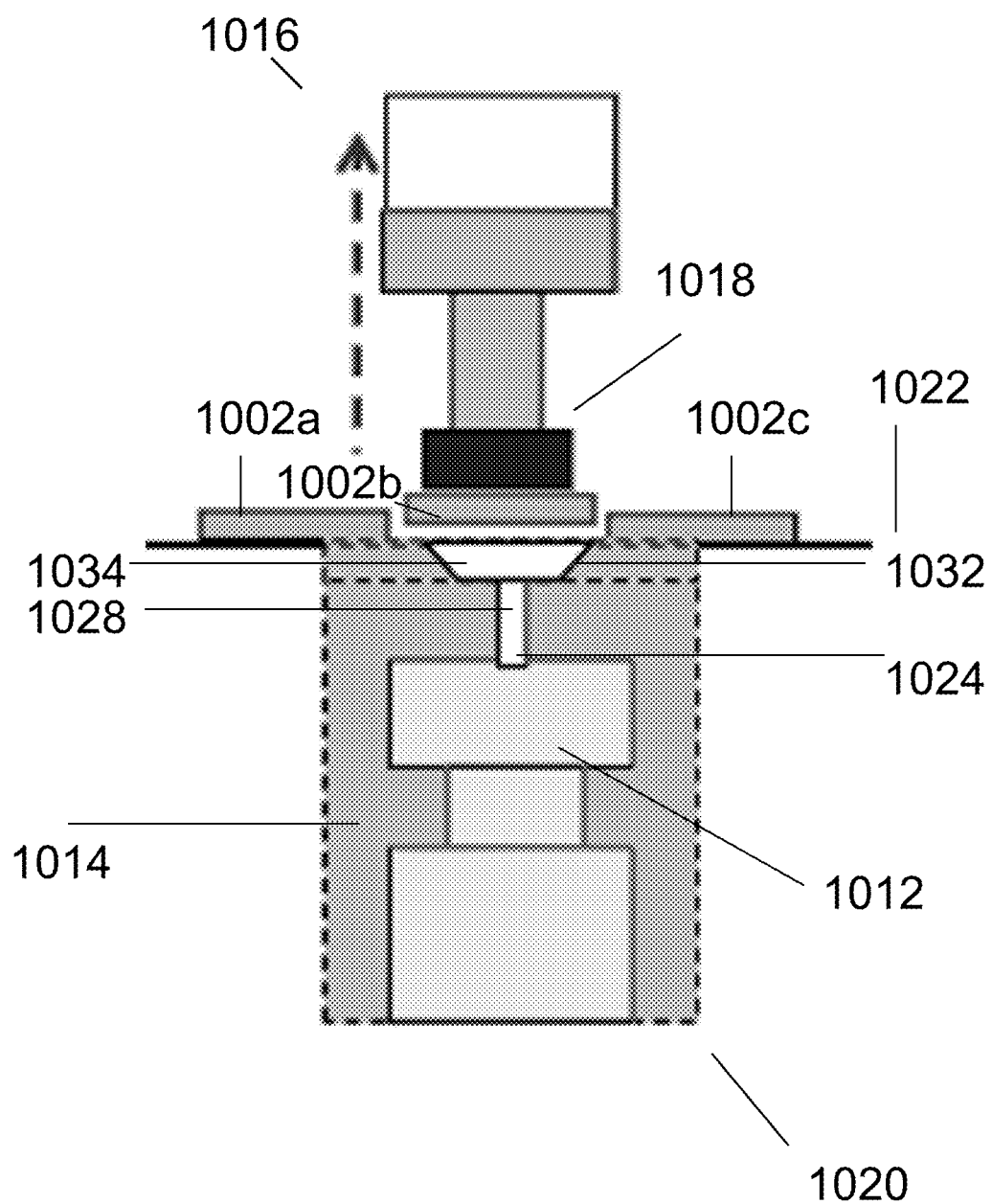

FIGS. 10A to 10C illustrate a method of handling a semiconductor die according to various embodiments. FIG. 10A is a schematic 1000a of a pick-up component 1016 being moved from a first position towards a second position according to various embodiments.

The assembly may include a carrier 1020 with a surface. The assembly may also include an adhesive tape 1022 fixed to the surface of the carrier 1020. The adhesive tape 1022 may be configured to adhere to the semiconductor die. The adhesive tape 1022 may include adhesive, the adhesion of which can be reduced by means of electromagnetic waves. The assembly may further include an electromagnetic source 1024 configured to apply electromagnetic waves to the adhesive tape 1022 to reduce adhesion of the adhesive tape 1022 to the semiconductor die 1002b. The surface of the carrier may include a cavity 1014. The tape 1022 may extend across an opening of the cavity 1014. The assembly may further include an optical fiber 1028 and an optical reflector 1032. The optical reflector 1032 may form a further cavity 1034. The cavity 1032 and the further cavity 1034 may be connected or separated. The optical fiber 1028 may couple the electromagnetic source 1024 to the further cavity 1034. The further cavity 1034 may have a first opening coupled to the optical fiber 1028 and a second opening directly under the tape 1022. The second opening may have an area substantially equal to an area of a back side of the semiconductor die 1002b. The electromagnetic source 1024 may be attached or coupled to pepper pot 1012. The assembly may further include a vacuum generator (not shown in FIGS. 10A to 10C) coupled to the cavity 1014. The vacuum generator may be configured to generate a suction force for holding the adhesive tape to the surface of the carrier when the semiconductor die is separated from the adhesive tape.

The pick-up component 1016 may include a bond head 1018. The method may include moving the bond head 1018 from a first position to a second position. When the pick-up component 1016 is at the first position, the bond head 1018 may be at a travel height (not in contact with the die 1002b). Further, when the pick-up component 1016 is at the second position, the bond head 1018 may be at a pick-up height (in contact with the die 1002b).

The semiconductor die 1002b may be one of a plurality of semiconductor dies 1002a, 1002b, 1002c cut or diced from a semiconductor wafer. The method may further include adhering the semiconductor die 1002b to the adhesive tape 1022 on the surface of a carrier 1020. The semiconductor die 1002b may be a part or portion of a wafer being adhered to the adhesive tape 1022. The wafer may then be further processed, such as diced or cut into a plurality of semiconductor dies 1002a, 1002b, 1002c, 1002c. Electromagnetic waves may be applied to reduce adhesion of a portion of the adhesive tape adhered to a particular die, i.e. 1002b, so that the particular die 1002b may be picked up (shown later in FIGS. 10B and 10C). In other words, the semiconductor die 1002b may be one of a plurality of semiconductor dies 1002a, 1002b, 1002c cut from a semiconductor wafer.

In various embodiments, the adhesive tape 1022 may be provided on the surface on the carrier 1020 before the semiconductor dies 1002a, 1002b, 1002c or wafer is adhered to the adhesive tape 1022. In various alternate embodiments, the adhesive tape 1022 may be adhered to the semiconductor dies 1002a, 1002b, 1002c or wafer before the adhesive tape and the semiconductor dies 1002a, 1002b, 1002c (or wafer) is provided on the surface of the carrier.

FIG. 10B is a schematic 1000b of the electromagnetic source 1024 being turned on according to various embodiments. The electromagnetic source 1024 may be turned on for a predetermined time interval, for instance for about 10 ms to about 1000 ms or from about 15 ms to about 500 ms or from about 20 ms to about 100 ms. When the electromagnetic source 1024 is turned on, the electromagnetic source 1024 may apply electromagnetic waves to the adhesive tape 1022. In various embodiments, the electromagnetic source 1024 may apply electromagnetic waves to a portion of the adhesive tape 1022 directly adhered to the semiconductor die 1002b. Electromagnetic waves emitted from the electromagnetic source 1024 may be coupled to the further cavity 1034 via the optical fiber 1028. Electromagnetic waves reaching the further cavity 1034 may be applied directly to the adhesive tape 1022 or may incident on the optical reflector 1032 one or more times before being redirected to the adhesive tape. As the second opening of the further cavity 1034 may have an area substantially equal to an area of a back side of the semiconductor die 1002*b*, only the portion of the adhesive tape 1022 directly adhered to the semiconductor die 1002*b* may receive the electromagnetic waves. Consequently, only adhesion of the portion of the adhesive tape 1022 directly adhered to the semiconductor die 1002*b* may be reduced while adhesion of the rest of the adhesive tape 1022 may remain substantially unchanged. For instance, portions of the adhesive tape 1022 adhered to the semiconductor dies 1002*a*, 1002*c* may remain substantially unchanged.

The adhesion of the portion of the adhesive tape 1022 directly adhered to the semiconductor die 1002*b* may be reduced from a first level to a second level, for instance from about 1000 mN/25 mm to about 70 mN/25 mm (based on Lintec D185) or from about 2000 mN/25 mm to about 50 mN/25 mm or from about 1500 mN/25 mm to about 50 mN/25 mm. The electromagnetic source 1024 may be a UV light or laser source.

As shown in FIG. 10B, the pick-up component 1016 may continue to be moved from the first position towards the second position. In various embodiments, the pick-up component 1016 may reach the second position before the electromagnetic source 1024 is turned on.

FIG. 10C is a schematic 1000*c* of the semiconductor die 1002*b* being picked up according to various embodiments. The semiconductor die 1002*b* may be picked up by the die pick-up component 1016, e.g. by the bond head 1018 of the die pick-up component 1016. Picking up the die 1002*b* may include applying a suction force by the pick-up component 1016, e.g. by turning on a vacuum generator or pneumatic bondhead cylinder (not shown) coupled to the pick-up component 1016 to create the suction force. A bondhead vacuum may be turned on for picking up the die 1002*b*. The die 1002*b* may be attached to the die pick-up component 1016, e.g. through bondhead 1018, via the suction force generated.

The die pick-up component 1016 may move from the second position towards the first position. As the adhesion of the semiconductor die 1002*b* to the adhesive tape 1022 has been reduced, the semiconductor die 1002*b* may be easily separated from the tape 1022. The adhesive tape 1022 may be held to the surface of the carrier 1020 via suction force generated by the vacuum generator coupled to the cavity 1014. The electromagnetic source 1024 may be turned off once or after the semiconductor die 1002 has been picked up.

Methods described herein may further contain analogous features of any assembly or component of an assembly described herein. Correspondingly, an assembly or component of an assembly described herein may further contain analogous features of any methods described herein.

Various embodiments are presented below:

1. An assembly for handling a semiconductor die, the assembly including a carrier with a surface; an adhesive tape fixed to the surface of the carrier, wherein the adhesive tape is configured to adhere to the semiconductor die, wherein the adhesive tape comprises adhesive, the adhesion of which can be reduced by means of electromagnetic waves; an electromagnetic source configured to apply electromagnetic waves to the adhesive tape to reduce adhesion of the adhesive tape to the semiconductor die; and a die pick-up component configured to pick up the semiconductor die from the adhesive tape.

2. The assembly of clause 1, wherein the surface of the carrier includes a cavity.

3. The assembly of clause 2, wherein the adhesive tape extends across an opening of the cavity on the surface of the carrier.

4. The assembly of any one of clauses 2 or 3, wherein the electromagnetic source is arranged within the cavity.

5. The assembly of any one of clauses 2 or 3, the assembly further including an optical fiber coupling the electromagnetic source to the cavity.

6. The assembly according to any of clauses 2 to 5, the assembly further including a vacuum generator coupled to the cavity, the vacuum generator configured to generate a suction force for holding the adhesive tape to the surface of the carrier when the semiconductor die is separated from the adhesive tape.

7. The assembly according to any of clauses 1 to 6, wherein the die pick-up component is configured to move from a first position to a second position to attach to the semiconductor die and further configured to move from the second position to the first position to separate the semiconductor die from the adhesive tape.

8. The assembly according to any of clauses 2 to 7, wherein the cavity comprises an optical reflector for directing electromagnetic radiation to the adhesive tape.

9. The assembly according to clause 8, wherein the optical reflector is arranged on an inner wall of the cavity.

10. The assembly according to any of clauses 1 to 9, the assembly further including a lens arranged between the electromagnetic source and the adhesive tape.

11. The assembly according to clause 10, wherein the lens is a divergent lens, the lens configured to diverge electromagnetic waves emitted from the electromagnetic source.

12. The assembly according to any of clauses 1 to 11, wherein the electromagnetic source is configured to apply ultraviolet light to the adhesive tape.

13. The assembly according to clause 12, wherein the electromagnetic source is an ultraviolet lamp.

14. The assembly according to clause 12, wherein the electromagnetic source is a laser diode.

15. The assembly according to any of clauses 1 to 12, wherein the carrier includes glass.

16. A method of handling a semiconductor die. The method includes: adhering the semiconductor die to an adhesive tape on a surface of a carrier, wherein the adhesive tape comprises adhesive, the adhesion of which can be reduced by means of electromagnetic waves; applying electromagnetic waves to the adhesive tape using an electromagnetic source to reduce adhesion of the adhesive tape to the semiconductor die; and picking up the semiconductor die from the adhesive tape when the adhesion of the adhesive tape to the semiconductor die has been reduced.

17. The method according to clause 16, wherein the adhesive tape is provided on the surface on the carrier before the semiconductor die is adhered to the adhesive tape.

18. The method according to clause 16, wherein the adhesive tape is adhered to the semiconductor die before the adhesive tape and the semiconductor die are provided on the surface of the carrier.

19. The method according to any of clauses 16 to 18, wherein the semiconductor die is one of a plurality of semiconductor dies cut from a semiconductor wafer.

20. The method according to any of clauses 16 to 19, wherein the surface of the carrier includes a cavity.

21. The method according to clause 20, wherein the adhesive tape extends across an opening of the cavity.

22. The method according to clause 21, wherein the electromagnetic source is arranged within the cavity.

23. The method according to clause 21, wherein an optical fiber is coupled between the electromagnetic source and the cavity.

24. The method according to any of clauses 16 to 23, the method further including: generating a suction force for holding the adhesive tape to the surface of the carrier when the semiconductor die is separated from the adhesive tape.

25. The method according to any of clauses 16 to 24, the method further including: moving a die pick-up component from a first position to a second position to attach to the semiconductor die; and moving from the second position to the first position to separate the semiconductor die from the adhesive tape.

26. The method according to any of clauses 16 to 25, wherein the cavity includes an optical reflector for directing electromagnetic radiation to the adhesive tape.

27. The method according to clause 26, wherein the optical reflector is arranged on an inner wall of the cavity.

28. The method according to any of clauses 16 to 27, wherein a lens is arranged between the electromagnetic source and the adhesive tape.

29. The method according to clause 29, wherein the lens is a divergent lens, the lens configured to diverge electromagnetic waves emitted from the electromagnetic source.

30. The method according to any of clauses 16 to 29, wherein the electromagnetic waves comprise ultraviolet light.

31. The method according to clause 30, wherein the electromagnetic source is an ultraviolet lamp.

32. The method according to clause 31, wherein the electromagnetic source is a laser diode.

33. The method according to any of clauses 16 to 32, wherein the carrier includes glass.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An assembly for handling a semiconductor die, the assembly comprising:
   a carrier with a surface; wherein the surface of the carrier comprises a cavity having an electromagnetic source arranged therein;
   an adhesive tape fixed to the surface of the carrier, wherein the adhesive tape is configured to adhere to the semiconductor die;
   the electromagnetic source configured to apply electromagnetic waves to the adhesive tape to reduce adhesion of the adhesive tape to the semiconductor die;
   an optical reflector coupled to the electromagnetic source; wherein the electromagnetic source is arranged between the carrier and a pepper pot;
   a vacuum generator coupled to the cavity, the vacuum generator configured to generate a suction force for holding the adhesive tape to the surface of the carrier when the semiconductor die is separated from the adhesive tape; and
   a die pick-up component configured to pick up the semiconductor die from the adhesive tape.

2. The assembly according to claim 1,
   wherein the die pick-up component is configured to move from a first position to a second position to attach to the semiconductor die and further configured to move from the second position to the first position to separate the semiconductor die from the adhesive tape.

3. The assembly according to claim 1,
   wherein the optical reflector is configured to direct electromagnetic radiation to the adhesive tape.

4. The assembly according to claim 1, the assembly further comprising:
   a lens arranged between the electromagnetic source and the adhesive tape.

5. The assembly according to claim 1,
   wherein the electromagnetic source is configured to apply ultraviolet light to the adhesive tape.

6. The assembly according to claim 1, further comprising an optical fiber coupled between a further cavity and the electromagnetic source.

7. The assembly according to claim 1, wherein the assembly is configured to remove a semiconductor chip in the absence of a mechanical force under the semiconductor chip where the mechanical force is configured to lift the semiconductor chip away from the adhesive tape.

8. The assembly according to claim 1, wherein a length of the wide second side is substantially equal to a length of the semiconductor die.

9. A method of handling a semiconductor die, the method comprising:
   adhering the semiconductor die to an adhesive tape on a surface of a carrier;
   wherein the surface of the carrier comprises a cavity having an electromagnetic source arranged therein;
   applying electromagnetic waves to the adhesive tape using the electromagnetic source to reduce adhesion of the adhesive tape to the semiconductor die;
   directing electromagnetic radiation towards the adhesive tape using an optical reflector coupled to the electromagnetic source; wherein the electromagnetic source is arranged between the carrier and a pepper pot;
   generating a suction force, by a vacuum generator coupled to the cavity, for holding the adhesive tape to the surface of the carrier when the semiconductor die is separated from the adhesive tape; and
   removing the semiconductor die from the adhesive tape when the adhesion of the adhesive tape to the semiconductor die has been reduced.

10. The method according to claim 9,
    wherein the adhesive tape is provided on the surface on the carrier before the semiconductor die is adhered to the adhesive tape.

11. The method according to claim 9,
    wherein the adhesive tape is adhered to the semiconductor die before the adhesive tape and the semiconductor die are provided on the surface of the carrier.

12. The method according to claim 9,
    wherein the semiconductor die is one of a plurality of semiconductor dies cut from a semiconductor wafer.

13. The method according to claim 9,
    wherein an optical fiber is coupled between the electromagnetic source and a further cavity.

14. The method according to claim 9, the method further comprising:

moving a die pick-up component from a first position to a second position to attach to the semiconductor die; and moving from the second position to the first position to separate the semiconductor die from the adhesive tape.

15. The method according to claim 9, wherein the cavity comprises an optical reflector for directing electromagnetic radiation to the adhesive tape.

16. The method according to claim 9, wherein a lens is arranged between the electromagnetic source and the adhesive tape.

17. The method according to claim 9, wherein the electromagnetic source is an ultraviolet lamp.

18. The method according to claim 9, wherein the electromagnetic source is a laser diode.

* * * * *